(12) United States Patent
Hurrell et al.

(10) Patent No.: US 7,250,880 B2
(45) Date of Patent: Jul. 31, 2007

(54) ANALOG TO DIGITAL CONVERTER

(75) Inventors: Christopher Peter Hurrell, Cookham (GB); Colin Charles Price, Newbury (GB)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/374,233

(22) Filed: Mar. 13, 2006

(65) Prior Publication Data

US 2006/0208937 A1 Sep. 21, 2006

Related U.S. Application Data

(60) Provisional application No. 60/663,653, filed on Mar. 21, 2005.

(51) Int. Cl.
*H03M 1/48* (2006.01)

(52) U.S. Cl. .................... 341/111; 341/155

(58) Field of Classification Search ......... 341/139–172
See application file for complete search history.

(56) References Cited

U.S. PATENT DOCUMENTS

| 4,945,359 | A | * | 7/1990 | Yamakido | 341/143 |
|---|---|---|---|---|---|
| 4,999,628 | A | * | 3/1991 | Kakubo et al. | 341/139 |
| 5,313,206 | A | * | 5/1994 | Davies et al. | 341/156 |
| 5,581,252 | A | * | 12/1996 | Thomas | 341/144 |
| 6,239,734 | B1 | * | 5/2001 | Bae et al. | 341/164 |
| 6,342,919 | B2 | * | 1/2002 | Opris | 348/241 |
| 6,476,749 | B1 | * | 11/2002 | Yeap et al. | 341/155 |
| 6,489,904 | B1 | * | 12/2002 | Hisano | 341/120 |
| 6,515,606 | B2 | * | 2/2003 | Lyden | 341/143 |
| 6,518,907 | B2 | * | 2/2003 | Tsai | 341/155 |
| 6,608,580 | B2 | * | 8/2003 | Hsueh | 341/155 |
| 6,614,373 | B1 | * | 9/2003 | Frazier | 341/143 |
| 6,664,911 | B2 | * | 12/2003 | Hirai | 341/159 |
| 6,683,550 | B2 | * | 1/2004 | Al-Awadhi | 341/143 |
| 6,734,817 | B2 | * | 5/2004 | Naka et al. | 341/155 |

OTHER PUBLICATIONS

Bhandari, S., et al, "A successive double-bit approximation technique for analog/digital conversion", IEEE Transactions on Circuits and Systems, vol. 37, No. 6, Jun. 1990, pp. 856-858.

* cited by examiner

*Primary Examiner*—Lam T. Mai
(74) *Attorney, Agent, or Firm*—Wolf, Greenfield & Sacks, P.C.

(57) ABSTRACT

An analog to digital converter comprising at least two analog to digital conversion engines and a controller for controlling the operation of the analog to digital conversion engines such that during a first phase of an analog to digital conversion process the engines collaborate such that a plurality of bits can be determined during a single trial step; and during a second phase of the analog to digital conversion the conversion engines work independently; and the controller receives the outputs of at least one of the conversion engines and processes them to provide an output word.

22 Claims, 10 Drawing Sheets

3 collaborating ADCs with binary weighted caps

Correctly determines answer to be between 24 and 25
Input = 24.75

| Trial | ADC | 32 | 16 | 8 | 4 | 2 | 1 | TOTAL | |
|---|---|---|---|---|---|---|---|---|---|
| T1 | E1 | 0 | 1 | 0 | 0 | 0 | 0 | 16 | |
| T1 | E2 | 1 | 0 | 0 | 0 | 0 | 0 | 32 | Reject |
| T1 | E3 | 1 | 1 | 0 | 0 | 0 | 0 | 48 | Reject |
| T2 | E1 | 0 | 1 | 0 | 1 | 0 | 0 | 20 | |
| T2 | E2 | 0 | 1 | 1 | 0 | 0 | 0 | 24 | |
| T2 | E3 | 0 | 1 | 1 | 1 | 0 | 0 | 28 | Reject |
| T3 | E1 | 0 | 1 | 1 | 0 | 0 | 1 | 25 | Reject |
| T3 | E2 | 0 | 1 | 1 | 0 | 1 | 0 | 26 | Reject |
| T3 | E3 | 0 | 1 | 1 | 0 | 1 | 1 | 27 | Reject |
| RESULT | | 0 | 1 | 1 | 0 | 0 | 0 | 24 | Correct |

Fig. 4A

3 collaborating ADCs with binary weighted caps

Bit weight of 16 wrongly rejected on first bit trial resulting in incorrect result of 15.
Input = 24.75

| Trial | ADC | 32 | 16 | 8 | 4 | 2 | 1 | TOTAL | |
|---|---|---|---|---|---|---|---|---|---|
| T1 | E1 | 0 | 1 | 0 | 0 | 0 | 0 | 16 | Reject! |
| T1 | E2 | 1 | 0 | 0 | 0 | 0 | 0 | 32 | Reject |
| T1 | E3 | 1 | 1 | 0 | 0 | 0 | 0 | 48 | Reject |
| T2 | E1 | 0 | 0 | 0 | 1 | 0 | 0 | 4 | |
| T2 | E2 | 0 | 0 | 1 | 0 | 0 | 0 | 8 | |
| T2 | E3 | 0 | 0 | 1 | 1 | 0 | 0 | 12 | |
| T3 | E1 | 0 | 0 | 1 | 1 | 0 | 1 | 13 | |
| T3 | E2 | 0 | 0 | 1 | 1 | 1 | 0 | 14 | |
| T3 | E3 | 0 | 0 | 1 | 1 | 1 | 1 | 15 | |
| RESULT | | 0 | 0 | 1 | 1 | 1 | 1 | 15 | |

Fig. 4B

4 collaborating ADCs with Redundant bits and Shift caps

Correctly determines input as being between 24.5 and 25.5
Input = 24.75

| Trial | ADC | 32 | 16 | R 16 | S -8 | 8 | 4 | R 4 | S -2 | 2 | 1 | R 1 | S -0.5 | TOTAL | |
|---|---|---|---|---|---|---|---|---|---|---|---|---|---|---|---|
| T1 | E1 | 0 | 0 | 1 | 1 | 0 | 0 | 0 | 0 | 0 | 0 | 0 | 0 | 8 | |
| T1 | E2 | 0 | 1 | 1 | 1 | 0 | 0 | 0 | 0 | 0 | 0 | 0 | 0 | 24 | |
| T1 | E3 | 1 | 0 | 1 | 1 | 0 | 0 | 0 | 0 | 0 | 0 | 0 | 0 | 40 | Reject |
| T1 | E4 | 1 | 1 | 1 | 1 | 0 | 0 | 0 | 0 | 0 | 0 | 0 | 0 | 56 | Reject |
| T2 | E1 | 0 | 1 | 1 | 1 | 0 | 0 | 1 | 1 | 0 | 0 | 0 | 0 | 26 | Reject |
| T2 | E2 | 0 | 1 | 1 | 1 | 0 | 1 | 1 | 1 | 0 | 0 | 0 | 0 | 30 | Reject |
| T2 | E3 | 0 | 1 | 1 | 1 | 1 | 0 | 1 | 1 | 0 | 0 | 0 | 0 | 34 | Reject |
| T2 | E4 | 0 | 1 | 1 | 1 | 1 | 1 | 1 | 1 | 0 | 0 | 0 | 0 | 38 | Reject |
| T3 | E1 | 0 | 1 | 1 | 1 | 0 | 0 | 0 | 1 | 0 | 0 | 1 | 1 | 22.5 | |
| T3 | E2 | 0 | 1 | 1 | 1 | 0 | 0 | 0 | 1 | 0 | 1 | 1 | 1 | 23.5 | |
| T3 | E3 | 0 | 1 | 1 | 1 | 0 | 0 | 0 | 1 | 1 | 0 | 1 | 1 | 24.5 | |
| T3 | E4 | 0 | 1 | 1 | 1 | 0 | 0 | 0 | 1 | 1 | 1 | 1 | 1 | 25.5 | Reject |
| RESULT | | 0 | 1 | 1 | 1 | 0 | 0 | 0 | 1 | 1 | 0 | 1 | 1 | 24.5 | |

Fig. 4C

4 collaborating ADCs with Redundant bits and Shift caps

Bit weight of 24 wrongly rejected on first bit trial.
Still correctly determines input as being between 24.5 and 25.5.
Input = 24.75

| Trial | ADC | 32 | 16 | R 16 | S -8 | 8 | 4 | R 4 | S -2 | 2 | 1 | R 1 | S -0.5 | TOTAL | |
|---|---|---|---|---|---|---|---|---|---|---|---|---|---|---|---|
| T1 | E1 | 0 | 0 | 1 | 1 | 0 | 0 | 0 | 0 | 0 | 0 | 0 | 0 | 8 | |
| T1 | E2 | 0 | 1 | 1 | 1 | 0 | 0 | 0 | 0 | 0 | 0 | 0 | 0 | 24 | Reject! |
| T1 | E3 | 1 | 0 | 1 | 1 | 0 | 0 | 0 | 0 | 0 | 0 | 0 | 0 | 40 | Reject |
| T1 | E4 | 1 | 1 | 1 | 1 | 0 | 0 | 0 | 0 | 0 | 0 | 0 | 0 | 56 | Reject |
| T2 | E1 | 0 | 0 | 1 | 1 | 0 | 0 | 1 | 1 | 0 | 0 | 0 | 0 | 10 | |
| T2 | E2 | 0 | 0 | 1 | 1 | 0 | 1 | 1 | 1 | 0 | 0 | 0 | 0 | 14 | |
| T2 | E3 | 0 | 0 | 1 | 1 | 1 | 0 | 1 | 1 | 0 | 0 | 0 | 0 | 18 | |
| T2 | E4 | 0 | 0 | 1 | 1 | 1 | 1 | 1 | 1 | 0 | 0 | 0 | 0 | 22 | |
| T3 | E1 | 0 | 0 | 1 | 1 | 1 | 1 | 1 | 1 | 0 | 0 | 1 | 1 | 22.5 | |
| T3 | E2 | 0 | 0 | 1 | 1 | 1 | 1 | 1 | 1 | 0 | 1 | 1 | 1 | 23.5 | |
| T3 | E3 | 0 | 0 | 1 | 1 | 1 | 1 | 1 | 1 | 1 | 0 | 1 | 1 | 24.5 | |
| T3 | E4 | 0 | 0 | 1 | 1 | 1 | 1 | 1 | 1 | 1 | 1 | 1 | 1 | 25.5 | Reject |
| RESULT | | 0 | 0 | 1 | 1 | 1 | 1 | 1 | 1 | 1 | 0 | 1 | 1 | 24.5 | |

Fig. 4D

4 collaborating ADCs with Redundant bits and Shift caps
Correctly determines input as being between 24.5 and 25.5
Input = 24.75

| Trial | ADC | 16 | 16 | 16 | R 16 | S -8 | 4 | 4 | 4 | R 4 | S -2 | 1 | 1 | 1 | R 1 | S -0.5 | TOTAL | |
|---|---|---|---|---|---|---|---|---|---|---|---|---|---|---|---|---|---|---|
| T1 | E1 | 0 | 0 | 0 | 1 | 1 | 0 | 0 | 0 | 0 | 0 | 0 | 0 | 0 | 0 | 0 | 8 | |
| T1 | E2 | 0 | 0 | 1 | 1 | 1 | 0 | 0 | 0 | 0 | 0 | 0 | 0 | 0 | 0 | 0 | 24 | |
| T1 | E3 | 0 | 1 | 1 | 1 | 1 | 0 | 0 | 0 | 0 | 0 | 0 | 0 | 0 | 0 | 0 | 40 | Reject |
| T1 | E4 | 1 | 1 | 1 | 1 | 1 | 0 | 0 | 0 | 0 | 0 | 0 | 0 | 0 | 0 | 0 | 56 | Reject |
| T2 | E1 | 0 | 0 | 1 | 1 | 1 | 0 | 0 | 0 | 1 | 1 | 0 | 0 | 0 | 0 | 0 | 26 | Reject |
| T2 | E2 | 0 | 0 | 1 | 1 | 1 | 0 | 0 | 1 | 1 | 1 | 0 | 0 | 0 | 0 | 0 | 30 | Reject |
| T2 | E3 | 0 | 0 | 1 | 1 | 1 | 0 | 1 | 1 | 1 | 1 | 0 | 0 | 0 | 0 | 0 | 34 | Reject |
| T2 | E4 | 0 | 0 | 1 | 1 | 1 | 1 | 1 | 1 | 1 | 1 | 0 | 0 | 0 | 0 | 0 | 38 | Reject |
| T3 | E1 | 0 | 0 | 1 | 1 | 1 | 0 | 0 | 0 | 0 | 1 | 0 | 0 | 0 | 1 | 1 | 22.5 | |
| T3 | E2 | 0 | 0 | 1 | 1 | 1 | 0 | 0 | 0 | 0 | 1 | 0 | 0 | 1 | 1 | 1 | 23.5 | |
| T3 | E3 | 0 | 0 | 1 | 1 | 1 | 0 | 0 | 0 | 0 | 1 | 0 | 1 | 1 | 1 | 1 | 24.5 | |
| T3 | E4 | 0 | 0 | 1 | 1 | 1 | 0 | 0 | 0 | 0 | 1 | 1 | 1 | 1 | 1 | 1 | 25.5 | Reject |
| RESULT | | 0 | 0 | 1 | 1 | 1 | 0 | 0 | 0 | 0 | 1 | 0 | 1 | 1 | 1 | 1 | 24.5 | |

Fig. 4E

4 collaborating ADCs with Redundant bits and Shift caps
Bit weight of 24 wrongly rejected on first bit trial.
Still correctly determines answer to be between 24.5 and 25.5
Input = 24.75

| Trial | ADC | 16 | 16 | 16 | R 16 | S -8 | 4 | 4 | 4 | R 4 | S -2 | 1 | 1 | 1 | R 1 | S -0.5 | TOTAL | |
|---|---|---|---|---|---|---|---|---|---|---|---|---|---|---|---|---|---|---|
| T1 | E1 | 0 | 0 | 0 | 1 | 1 | 0 | 0 | 0 | 0 | 0 | 0 | 0 | 0 | 0 | 0 | 8 | |
| T1 | E2 | 0 | 0 | 0 | 1 | 1 | 0 | 0 | 0 | 0 | 0 | 0 | 0 | 0 | 0 | 0 | 8 | Reject! |
| T1 | E3 | 0 | 1 | 0 | 1 | 1 | 0 | 0 | 0 | 0 | 0 | 0 | 0 | 0 | 0 | 0 | 24 | Reject |
| T1 | E4 | 1 | 1 | 0 | 1 | 1 | 0 | 0 | 0 | 0 | 0 | 0 | 0 | 0 | 0 | 0 | 40 | Reject |
| T2 | E1 | 0 | 0 | 0 | 1 | 1 | 0 | 0 | 0 | 1 | 1 | 0 | 0 | 0 | 0 | 0 | 10 | |
| T2 | E2 | 0 | 0 | 0 | 1 | 1 | 0 | 0 | 1 | 1 | 1 | 0 | 0 | 0 | 0 | 0 | 14 | |
| T2 | E3 | 0 | 0 | 0 | 1 | 1 | 0 | 1 | 1 | 1 | 1 | 0 | 0 | 0 | 0 | 0 | 18 | |
| T2 | E4 | 0 | 0 | 0 | 1 | 1 | 1 | 1 | 1 | 1 | 1 | 0 | 0 | 0 | 0 | 0 | 22 | |
| T3 | E1 | 0 | 0 | 0 | 1 | 1 | 1 | 1 | 1 | 1 | 1 | 0 | 0 | 0 | 1 | 1 | 22.5 | |
| T3 | E2 | 0 | 0 | 0 | 1 | 1 | 1 | 1 | 1 | 1 | 1 | 0 | 0 | 1 | 1 | 1 | 23.5 | |
| T3 | E3 | 0 | 0 | 0 | 1 | 1 | 1 | 1 | 1 | 1 | 1 | 0 | 1 | 1 | 1 | 1 | 24.5 | |
| T3 | E4 | 0 | 0 | 0 | 1 | 1 | 1 | 1 | 1 | 1 | 1 | 1 | 1 | 1 | 1 | 1 | 25.5 | Reject |
| RESULT | | 0 | 0 | 1 | 1 | 1 | 0 | 0 | 0 | 0 | 1 | 0 | 1 | 1 | 1 | 1 | 24.5 | |

Fig. 4F

4 collaborating ADCs with last 3 bit trials performed by converter E1 alone
Correctly gives result of 24.
Input = 30.75

| Trial | ADC | offset | Phase | 32 | 16 | R<br>16 | S<br>-8 | 8 | 4 | R<br>4 | S<br>-2 | R<br>4 | S<br>-2 | 2 | 1 | TOTAL<br>actual | ideal | |
|---|---|---|---|---|---|---|---|---|---|---|---|---|---|---|---|---|---|---|
| T1 | E1 | 0 | 1 | 0 | 0 | 1 | 1 | 0 | 0 | 0 | 0 | 0 | 0 | 0 | 0 | 8 | 8 | |
| T1 | E2 | 1.5 | 1 | 0 | 1 | 1 | 1 | 0 | 0 | 0 | 0 | 0 | 0 | 0 | 0 | 25.5 | 24 | |
| T1 | E3 | 0 | 1 | 1 | 0 | 1 | 1 | 0 | 0 | 0 | 0 | 0 | 0 | 0 | 0 | 40 | 40 | Reject |
| T1 | E4 | 0 | 1 | 1 | 1 | 1 | 1 | 0 | 0 | 0 | 0 | 0 | 0 | 0 | 0 | 56 | 56 | Reject |
| T2 | E1 | 0 | 1 | 0 | 1 | 1 | 1 | 0 | 0 | 1 | 1 | 0 | 0 | 0 | 0 | 26 | 26 | |
| T2 | E2 | 1.5 | 1 | 0 | 1 | 1 | 1 | 0 | 1 | 1 | 1 | 0 | 0 | 0 | 0 | 31.5 | 30 | Reject |
| T2 | E3 | 0 | 1 | 0 | 1 | 1 | 1 | 1 | 0 | 1 | 1 | 0 | 0 | 0 | 0 | 34 | 34 | !Reject |
| T2 | E4 | 0 | 1 | 0 | 1 | 1 | 1 | 1 | 1 | 1 | 1 | 0 | 0 | 0 | 0 | 38 | 38 | Reject |
| T3 | E1 | 0 | 2 | 0 | 1 | 1 | 1 | 0 | 0 | 1 | 1 | 1 | 1 | 0 | 0 | 28 | 28 | |
| T4 | E1 | 0 | 2 | 0 | 1 | 1 | 1 | 0 | 0 | 1 | 1 | 1 | 1 | 1 | 0 | 30 | 30 | |
| T5 | E1 | 0 | 2 | 0 | 1 | 1 | 1 | 0 | 0 | 1 | 1 | 1 | 1 | 1 | 1 | 31 | 31 | Reject |
| RESULT | | | | 0 | 1 | 1 | 1 | 0 | 0 | 1 | 1 | 1 | 1 | 1 | 0 | | 30 | |

Fig. 4G

4 collaborating ADCs with last 2 bit trials performed by converter E1 alone
Incorrectly gives result of 29.
Input = 30.75

| Trial | ADC | offset | Phase | 32 | 16 | R<br>16 | S<br>-8 | 8 | 4 | R<br>4 | S<br>-2 | 2 | 1 | TOTAL<br>actual | ideal | |
|---|---|---|---|---|---|---|---|---|---|---|---|---|---|---|---|---|
| T1 | E1 | 0 | 1 | 0 | 0 | 1 | 1 | 0 | 0 | 0 | 0 | 0 | 0 | 8 | 8 | |
| T1 | E2 | 1.5 | 1 | 0 | 1 | 1 | 1 | 0 | 0 | 0 | 0 | 0 | 0 | 25.5 | 24 | |
| T1 | E3 | 0 | 1 | 1 | 0 | 1 | 1 | 0 | 0 | 0 | 0 | 0 | 0 | 40 | 40 | Reject |
| T1 | E4 | 0 | 1 | 1 | 1 | 1 | 1 | 0 | 0 | 0 | 0 | 0 | 0 | 56 | 56 | Reject |
| T2 | E1 | 0 | 1 | 0 | 1 | 1 | 1 | 0 | 0 | 1 | 1 | 0 | 0 | 26 | 26 | |
| T2 | E2 | 1.5 | 1 | 0 | 1 | 1 | 1 | 0 | 1 | 1 | 1 | 0 | 0 | 31.5 | 30 | Reject |
| T2 | E3 | 0 | 1 | 0 | 1 | 1 | 1 | 1 | 0 | 1 | 1 | 0 | 0 | 34 | 34 | !Reject |
| T2 | E4 | 0 | 1 | 0 | 1 | 1 | 1 | 1 | 1 | 1 | 1 | 0 | 0 | 38 | 38 | Reject |
| T3 | E1 | 0 | 2 | 0 | 1 | 1 | 1 | 0 | 0 | 1 | 1 | 1 | 0 | 28 | 28 | Reject |
| T4 | E1 | 0 | 2 | 0 | 1 | 1 | 1 | 0 | 0 | 1 | 1 | 1 | 1 | 29 | 29 | Reject |
| RESULT | | | | 0 | 1 | 1 | 1 | 0 | 0 | 1 | 1 | 1 | 1 | | 29 | |

Fig. 4H

ANALOG TO DIGITAL CONVERTER

FIELD OF INVENTION

The present invention relates to an analog to digital converter using a plurality of conversion engines acting in a co-operative state for a first part of a conversion cycle to allow multiple bits to be examined at each trial.

BACKGROUND OF THE INVENTION

Users of analog to digital converters generally wish to see high conversion accuracy and high conversion rates. These objectives are generally opposed, and become more difficult to achieve when a user also seeks for such devices to be relatively inexpensive.

Flash converters are known to provide high conversion speed, albeit at increased cost and with limited resolution. In essence a flash converter consists of a plurality of comparators, each comparator connected to a respective tap on a resistor chain such that each converter is responsible for testing for one, and only one, of the possible digital outputs. Therefore an 8 bit flash converter requires 255 individual comparators to be fabricated therein, each connected to a respective tap of a resistor chain. Each comparator compares an input signal with its respective reference signal, and then a conversion circuit is responsive to the output of each of the comparators and uses this to determine where a transition between two adjacent comparators occurs so as to provide a digital output word.

Where reduced cost and/or greater accuracy is required, then it is known to use a successive approximation converter. A successive approximation converter performs successive bit trials to see, whether, once the bit is set if the analog value that it is converting is greater or less than the equivalent value represented by the bit being trialled, and the sum of any previous kept bits. Thus, a successive approximation converter seeking to produce an 8 bit output has to perform 8 bit trials.

The paper "A Successive Double Bit Approximation Technique for Analog/Digital Conversion" Sanjay M. Bhandari and Sudhir Aggarwal, IEEE Transactions on Circuits and Systems, Vol. 37, No. 6, June 1990 discloses a converter which, in a first step, tests the most significant bits 0100, 1000 and 1100, and repeats this sequence is second and subsidiary steps. This system uses two D/A converters, one to output the current bit trial and the other to set the next most significant bit, and the outputs are added and subtracted in the analog domain to generate three decision thresholds. The double bit trial is continued to the end of the conversion. The formation of sums and differences in the analog domain could give rise to a source of conversion error. The technique was only described in the context of an 8 bit converter.

U.S. Pat. No. 6,239,734 discloses an analog to digital converter having three converters which co-operate such that each trial can determine two bits within the digital word. An example shown in FIG. 7 of U.S. Pat. No. 6,239,734 discloses the conversion of a 6 bit word where the analog input signal has a value which, when converted, corresponds to "110011". In accordance with the normal successive approximation process, a first register is set to trial the words "100000" however a second register SAR+ is set to trial the word "110000" and a third register SAR− is set to trial the word "010000". In this first trial, the analog value is greater than each of the trial words and hence the first two bits in the trial can be set to "11". In the second trial the two bits being tested are set to "10, 11, and 01" in the registers, respectively, such that the first register trials a bit stream "111000" the SAR+ register trials the bit stream "111100" and the SAR− register trials the bit stream "110100" at the end of this trial the analog value is less than each of the trialled words and hence the next two bits can be set to "00". In the third step, the process is completed when two of the trial words are less than the analog value and the third trial word is not, thereby recovering the word "11001" therefore the conversion of a six bit word is converted in three trials and in general and end bit word is converted in $$\frac{N}{2}$$

trials.

Whilst the performance of the device disclosed in U.S. Pat. No. 6,239,734 looks impressive it suffers from several significant shortcomings. One of these shortcomings results from the fact that, in the real world, components and systems, are noisy, whether this noise comes via the power supply lines, or is from self generated thermal noise. In general, when a circuit designer seeks to use three successive approximation converters to do the job that previously had been done by one he can either choose to use three times the die area and sink three times as much current by repeating the original approximation converter design, or he can shrink the size of the converter by using smaller components. The first option, that is tripling the die area and the power consumption is generally not favoured as it makes the device more expensive to manufacture and less likely to be adopted by users as it eats into their power budget, which is particularly important in the context of mobile devices which are battery powered.

However simply making the individual converters smaller carries a noise penalty. This is because the thermal voltage fluctuations generated across a capacitor are proportional to $$\frac{kT}{C}$$

where k is Boltzmanns constant, T is the temperature in kelvin and C is the capacitance of the capacitor. It could therefore be seen that smaller capacitors have greater thermal noise appearing at their terminals. In the arrangement of U.S. Pat. No. 6,239,734 thermal noise occurring at any one of the successive approximation converters can result in that converter giving a false result and will skew the entire conversion process. Put another way, although three converters are used rather than making the converter less sensitive to thermal noise, it effectively makes it more sensitive to thermal noise. This probably does not represent an issue with the context of the 6 bit of the converter, but with modern converters requiring 12 bit or greater accuracy, the presence of noise in the real world is now a significant factor in analog to digital converter design.

An additional important shortcoming of U.S. Pat. No. 6,239,734 is that collaborative bit trials are only possible as long as the miss-match errors between collaborative conversion engines are smaller than the resolution of the converter. This may in practice limit such ADCs to about 10 bits.

SUMMARY OF THE INVENTION

According to a first aspect of the present invention there is provided an analog to digital converter comprising a plurality of analog to digital conversion engines and a controller for controlling the operation of the analog to digital conversion engines such that:
a) during a first phase of an analog to digital conversion process the conversion engines collaborate such that a plurality of bits can be determined during a single trial step;
b) during a second phase of the analog to digital conversion process the conversion engines work independently; and
c) the controller receives the outputs of the conversion engines and processes them to provide an output word.

It is thus possible to provide a analog to digital converter which typically uses at least three analog to digital conversion engines in a collaborative manner during a first part of a conversion where thermal noise is unlikely to effect the conversion results, and then to operate the converters independently during a second phase such that each converter finishes its conversion process without reference to or interference from the other converters. Consequently any noise in the converters is no longer correlated, and the results are independent and hence an effective signal to noise power ratio improvement of $$\frac{1}{P},$$

where P is the number of the converters, can be achieved when the results from the independent converters are digitally combined.

Advantageously the analog to digital converter has more than three conversion engines. In a preferred embodiment the analog to digital converter has four conversion engines, such an arrangement allows improved recovery from conversion errors. Generally speaking, at any bit trial, other than the first trial, with just 3 conversion engines, the trial space is bounded to be one quarter of the size of the previous extent of the trial space. However as will be explained later, when using an extra conversion engine the subsequent trial space can be made larger than one quarter of the size of the previous trial space and hence conversion errors resulting from settling and other errors can be corrected. Thus, if the bit trials are counted using an integer N, then the trial space of an $N+1_{th}$ bit trial is larger than one quarter of the trial space of the Nth bit trial. However, as the trial space is less than one half of the size of the preceding space then a final answer is obtained more quickly than is the case using a single SAR converter.

Advantageously, when proceeding from one trial to the next trial and using more than three conversion engines, the trial range is offset. In an embodiment of the present invention the trial range is offset by a value corresponding to half of the current step size (that is a value corresponding to half of the least significant bit being determined). This allows errors of either sign to be corrected.

It should be noted that the redundancy allowed by the addition of the $4^{th}$ converter engine provides correction of previous errors in the conversion without the cost of any additional bit trials. Of course it is possible to add redundancy while using just 3 converter engines but this requires additional redundant bits to be added which incur the cost of additional bit trials. This could, for example, be achieved by making the new trial range half, rather than one quarter, that of the previous bit trial and also offsetting the trial range to provide correction of errors of both (+ and −) sign.

A problem with using multiple conversion engines is that it is difficult to ensure that each of the engines is identical. Each conversion engine is likely to have a different voltage offset associated with it. Furthermore each conversion engine may also have a different gain error and an integral non-linearity error.

Advantageously one or more of the analog to digital conversion engines is provided with an offset compensation circuit. The offset compensation circuit may advantageously comprise a digital to analog converter for introducing an offset voltage to the conversion engine whose magnitude and advantageously sign can be controlled in order to correct for the offset within the associated conversion engine. Thus, over a series of conversion cycles the controller can examine the outputs of each of the conversion engines, while they are operating independently, to see whether they agree. If one conversion engine repeatedly reads higher or lower than the others, then an offset can be applied to it, or to the others, or to a mixture of them to bring each of the output words into conformity. In order to maintain accuracy, the value of the sum of the offset words applied to each of the converters may be adjusted to maintain a preset value or alternatively the sum of the offset words may be formed and an appropriate correction applied to the final output word that is output by the controller.

Further improvements in error cancellation can be achieved by halting the conversion during the first phase of the trial and setting all of the conversion engines to receive the same conversion word and then temporarily shorting analog output terminals of the capacitor arrays within the conversion engines together in order to ensure that they all read the same voltage for the same digital word. This causes charge redistribution and compensates for gain and integral non-linearity (INL) errors between the conversion engines.

Surprisingly for a higher performance analog to digital converter, converter performance can be enhanced by deliberately introducing noise. The introduction of a random or pseudorandom noise or dither independently to each of the conversion engines once per conversion cycle where the resolution of the dither is of the order of 1 LSB or less, can improve performance. Effectively the introduction of the dither allows the conversion engines to distinguish between analog values that are close to the LSB transition threshold during the second phase whilst the converters are running independently and providing that the size of the dither is known then this can be used to provide an improvement in the resolution of the overall performance of the analog to digital converter.

According to a second aspect of the present invention, there is provided an analog to digital converter comprising a plurality of analog to digital conversion engines, each having a sampling capacitor in combination with a digital to analog converter, and wherein a controller is provided for controlling the operation of the conversion engines such that:
a) during a first phase of an analog to digital conversion process, the conversion engines collaborate such that a plurality of bits can be determined in a single trial step; and
b) during a second phase of the analog to digital conversion process, the conversion engines are connected together so as to form a composite converter for use in single bit trials.

As noted before, the conversion engines are generally made smaller so that a plurality of them can be provided without a corresponding increase in power consumption occurring. However, making the capacitors within the sampling digital to analog converter stage of the ADC smaller gives rise to an increase in thermal noise. Similarly the capacitors are normally buffered by one or more amplifiers, and these are a source of noise. However, by connecting the individual outputs of the capacitor stages within the conversion engines in parallel during the second phase, the thermal noise on the capacitors is reduced because the capacitance is increased. Further improvements can be made if the outputs of the buffers are connected together. The signal can then be applied to a single comparator/latch which tests to see whether the signal provided to it is greater or less than a decision threshold.

According to a third aspect of the present invention there is provided a method of converting an analog value into a digital equivalent, the method comprising the steps of:
  a. sampling a signal to be converted into a plurality of sucessive approximation analog to digital converters;
  b. operating the converters in a first phase of the conversion such that at least two bits can be determined during at least one successive approximation trial;
  c. operating the converters in a second phase of the conversion such that the converters operate independently such that fewer bits are determined during each successive approximation trial than were determined during the first phase; and
  d. outputting a result obtained from at least one of the converters.

According to a fourth aspect of the present invention there is provided a method of converting an analog value into a digital value, the method comprising the steps of:
  a) sampling a signal to be converted onto at least two successive approximation analog to digital converters;
  b) operating the converters in a first phase of operation such that they co-operate to determine at least two bits during at least one successive approximation trial; and
  c) in a second phase of operation connecting sampling capacitor arrays of the converters in parallel so as to form a combined converter, and continuing the bit trials.

BRIEF DESCRIPTION OF THE DRAWINGS

The present invention will further be described, by way of non limiting example, with reference to the accompanying drawings, in which:

FIGS. 4a to 4h illustrate bit trials under varying circumstances;

DESCRIPTION OF PREFERRED EMBODIMENTS

Figure 1:
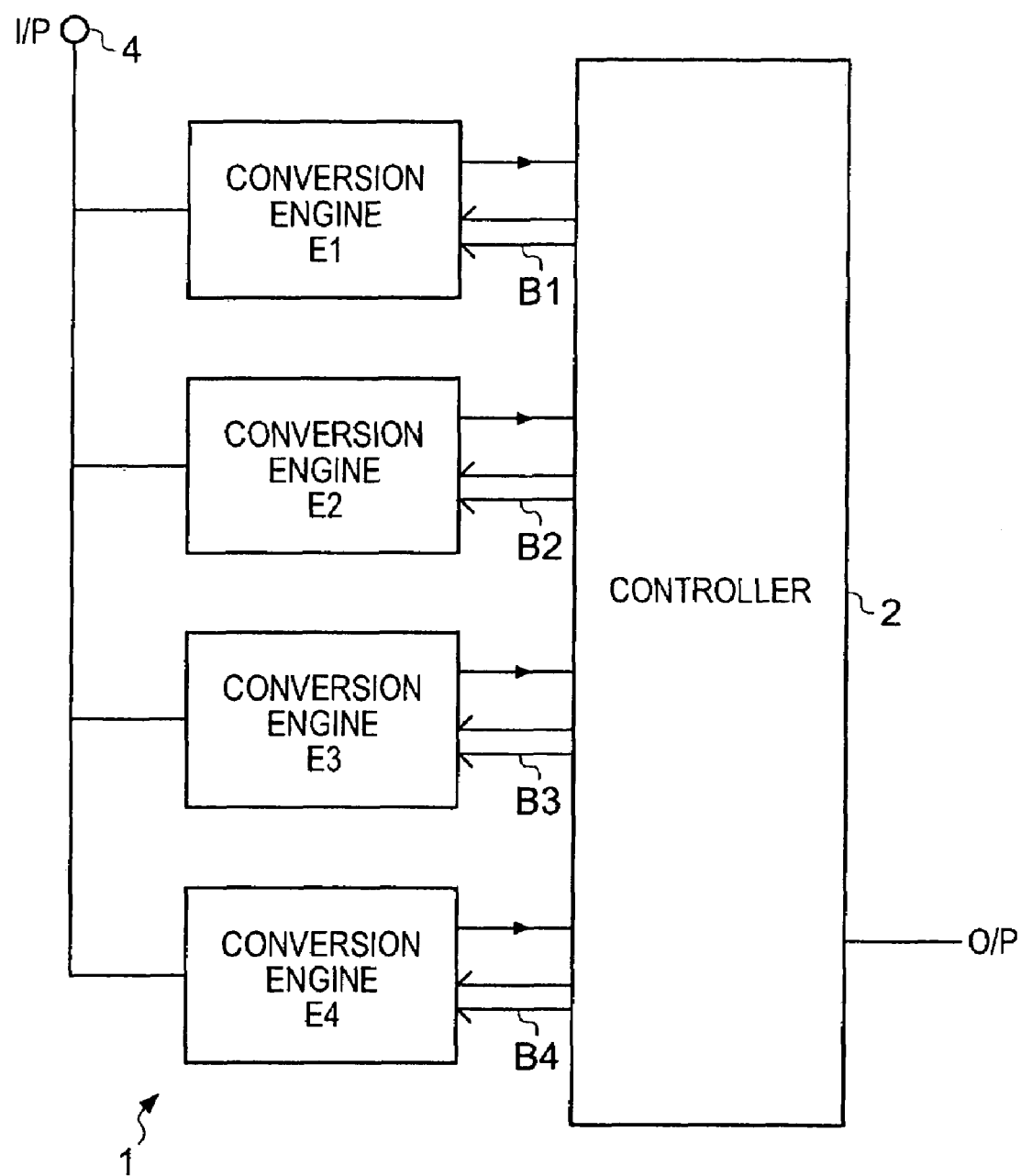
FIG. 1 schematically illustrates an analog to digital converter constituting an embodiment of the present invention.

FIG. 1 schematically illustrates a successive approximation analog to digital converter, generally labelled 1, constituting an embodiment of the present invention. The converter comprises a plurality of analog to digital conversion engines which, advantageously, are switched capacitor analog to digital converters having the occasional redundant capacitor. These redundant capacitors are additional to the normal binary weighted bits and provide some correction of errors made in previous bit trials. Three conversion engines labelled E1, E2 and E3 are provided, although in a preferred embodiment of the present invention a fourth engine labelled E4 is also provided. Each of the engines E1 to E4 is in communication with a controller generally designated 2 which receives an output from a comparator provided internally within each of the conversion engines E1 to E4, and which also has a control bus designated B1 to B4 for controlling the switches associated with each of the capacitors in the respective conversion engine E1 to E4. Each conversion engine E1 to E4 is also connected to an analog input 4.

Figure 2:
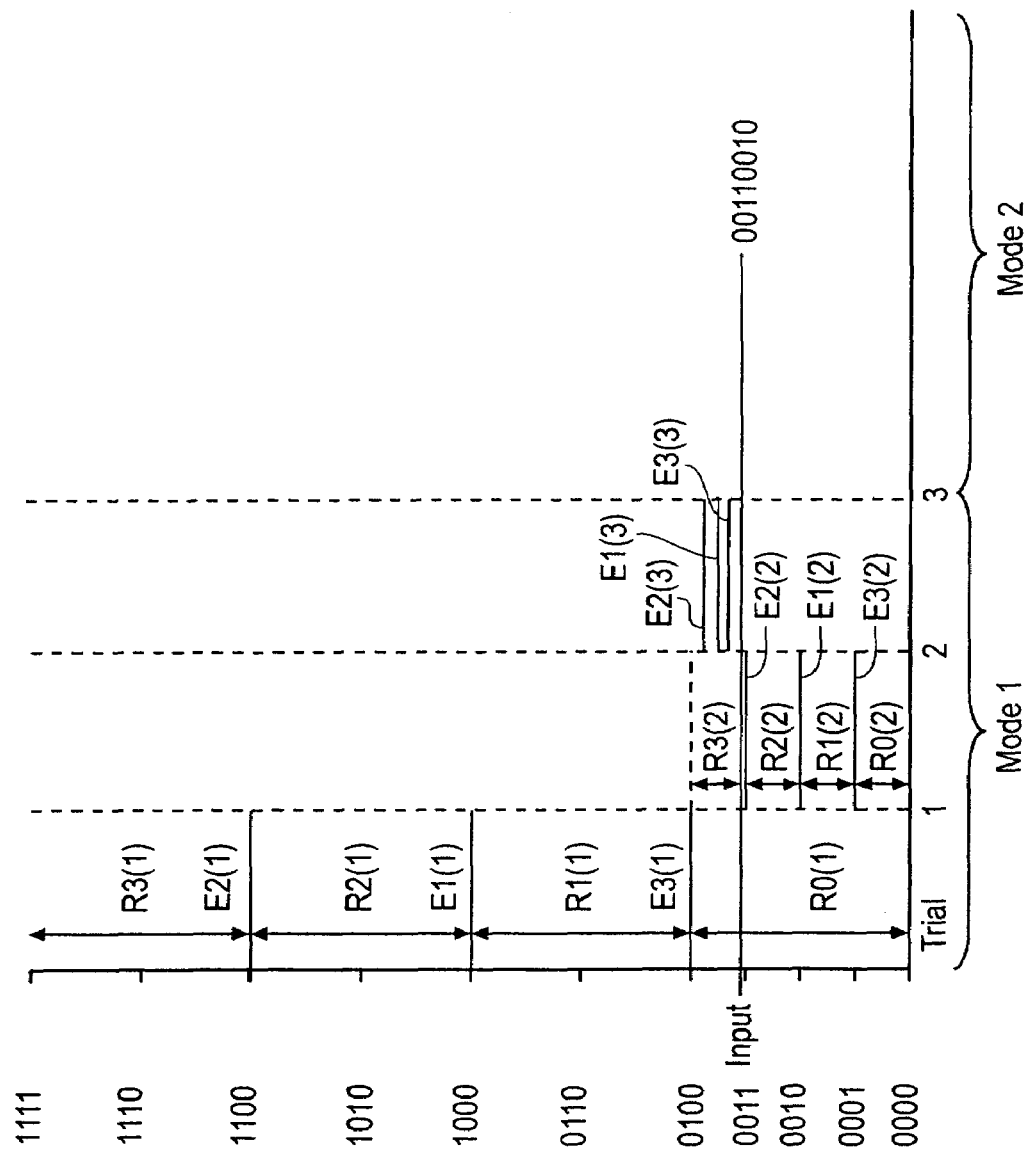
FIG. 2 schematically illustrates the conversion process for an embodiment having three conversion engines.

The operation of the converter will now be described. Initially it is useful to consider an embodiment of the invention in which only three conversion engines are provided. FIG. 2 schematically illustrates the conversion process for converting an 8 bit word where the converted value of the word corresponds to "00110010". As noted before the converter is capable of much greater levels of accuracy, but this example is deliberately kept simple for clarity. During the first trial the first converter E1 is set such that its two most significant bits are set to "10" and the rest of its bits are set to "0", this condition is designated by the line E1(1). Converter E2 is set such that its most significant bits are set to "11" and the remainder of its bits are set to "0", this condition is designated by the line E2(1). Finally the third converter E3 is set such that its most significant bits are "01" and the remainder of its bits are set to "0". This condition is represented by the line E3(1). Referring to FIG. 2 it can be seen that the three converters segment the conversion space into four distinct ranges, the lowermost range, designated R0(1) spans the lowermost quarter of the conversion space, i.e. from "00000000" to "01000000". The next decision range designated R1(1) spans the next quarter of the input space, i.e. from "01000000" to "10000000". The next decision range, designated R2(1) spans the next quarter of the input space, that is from "10000000" to "11000000" and the final decision range, designated R3(1) spans the input range from "11000000" to "11111111". The range of values that can be investigated can be thought of as forming a "trial space" which for this first trial extends from 00000000 to 11111111.

At the end of the first trial, the outputs of the comparators, are checked and the controller notes that the analog input value is less than the threshold values E1(1), E2(1) and E3(1). As a result, the first two bits in the trial are set to "00" and the trial then progresses to the second trial. Therefore we have already determined that the analog input signal lies within the range R0(1).

As can be seen in FIG. 2, the next trial when using three converters only conducts further investigations within the range represented by R0(1). Thus this range from 00000000 to 01000000 becomes the trial space for the second trial. Thus the next two bits of converter E1 are set to "10" such that the value under test becomes "0010" as represented by the line E1(2). The second conversion engine has its next two bits set to "11" such that it tests the word "0011". This value is represented by the line E2(2) in FIG. 2. Finally the third conversion engine has its next two bits set to "01" such that it tests the word "0001" as represented by the line E3(2).

Thus, each conversion engine is now checking a conversion range which corresponds to one quarter of the size of the previous conversion range. Thus the third conversion engine E3 is checking the conversion range R0(2) shown in FIG. 2 whose span is clearly one quarter of that of R0(1). Similar decision spaces R1(2) defined between the decision thresholds for the conversion engine E3 and the conversion engine E1 exists. Another decision range designated R2(2) exists between the decision threshold for conversion engine E1 and conversion engine E2, and finally the decision range R3(2) exists between the decision threshold for the conversion engine E2 and the decision range determined by the previous conversion. At the end of the second trial, the controller determines from the output of each of the conversion engines that the analog value was above the values determined by the next two bits for each of the engines, and hence the third and fourth bits in the trial are set to "11".

As can be seen from FIG. 2, the next trial occurs only within the decision range R3(2), which delimits the trial range of the third trial, and again the three thresholds are set at the quarter, half and three quarter distances between the top and bottom of that decision range. It can be seen from FIG. 2 that each of these thresholds, designated E1(3), E2(3) and E3(3) corresponding to the decision thresholds for the first second and third conversion engines respectively is above the analog value. Therefore the controller discards each of these bits and hence determines that the word converted so far is "001100". It should also be noted, however that noise or settling errors occurring on any one of the conversion engines could have changed the result. The effect of noise is unlikely whilst the actual analog value remains fairly distant from the decision threshold but we can see diagrammatically during the second trial that noise occurring on the second conversion engine E2 could erroneously have caused it to signal that the analog value was below its decision threshold rather than above the decision threshold as is actually the case. Such noise would represent an irrecoverable error in the prior art. However in the present invention the analog to digital converters can recover from this because they include redundant bits. The analog to digital converter changes operational modes after several trials have been performed, in this case after the third trial and moves to a second mode where each of the analog to digital converters works independently as a single successive approximation converter independently of the others. This means that the system as a whole is now less influenced by the effects of thermal noise when the results are combined digitally, for example by averaging, at the controller 2.

Furthermore, when digital to analog converters having redundant bits are used, these are able to recover from a previously mis-set trial decision and therefore the present invention would recover from the incorrect decision that might have occurred at trial 2 to return "00110010" as the output word as opposed to the prior art in U.S. Pat. No. 6,239,734 which, if it had made a wrong decision at trial 2 would return "00101111".

After several "shared" or co-operative bit trials are performed, the converter switches its mode of operation such that each individual converter, E1, E2, E3 works independently to achieve an end result. The end results are then combined by the controller. The combination could be done by averaging the output words, or by merely summing them and accepting that the digital output word is three times too large.

The chip manufacturer generally determines how many comparisons should be made in the first cooperative bit trial mode before the analog to digital converter switches modes to the second mode in which each of the converters works independently. However, this could also be set in a user controllable register or the like.

Having considered operation of the present invention with three conversion engines, it is now possible to see how the use of four conversion engines can be accommodated, and the benefits from such an approach.

Figure 3:
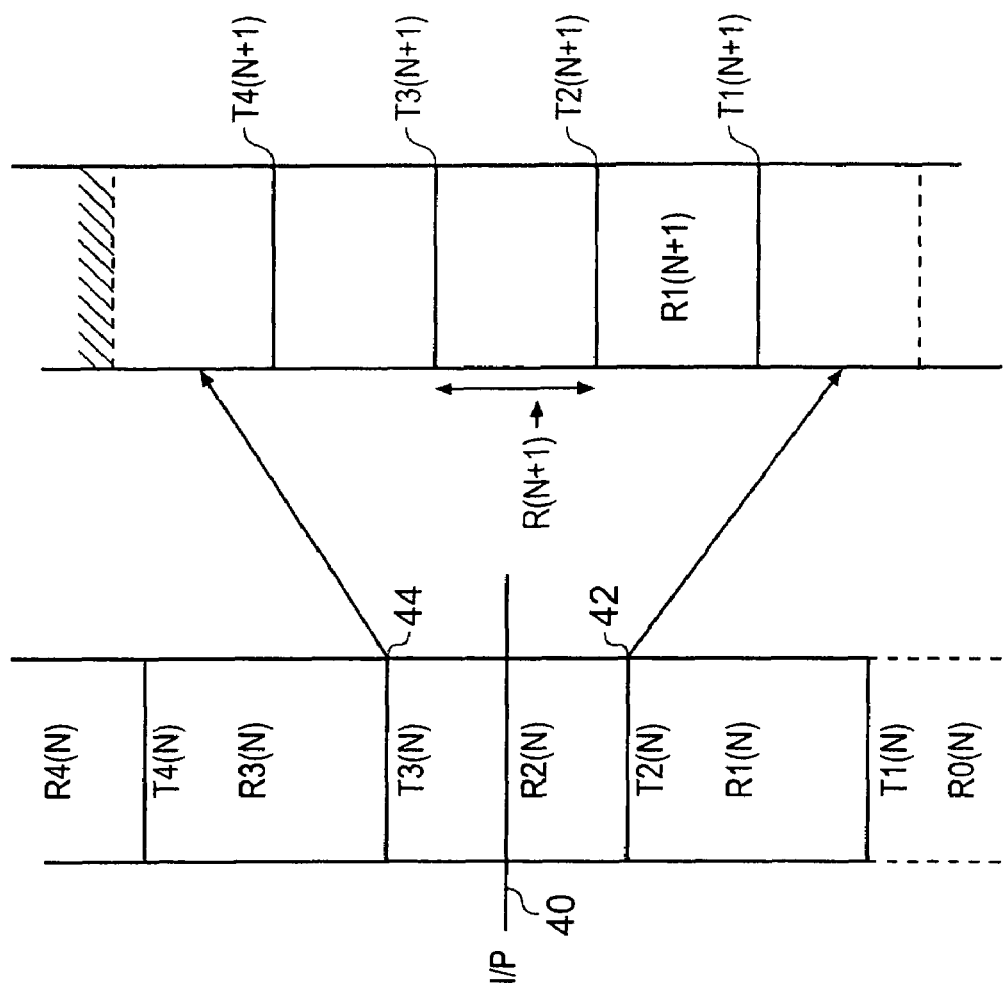
FIG. 3 schematically illustrates the conversion process for an embodiment having four conversion engines.

When we move to the next example as set out in FIG. 3 we no longer have the simplicity of the three converter system and the nomenclature that was adopted to explain the three converter system is no longer appropriate. Instead each converter E1 to E4 tests, during on Nth bit trial its own conversion threshold T1(N) to T4(N) respectively against the input value.

It will also be apparent that, as with the earlier example, a search space exists between each pair of adjacent thresholds. Space R1(N) exists between threshold T1(N) and T2(N). Search space R2(N) exists between threshold T2(N) and T3(N), and similarly search space R3(N) exists between threshold T3(N) and T4(N). A search space RO(N) exists below threshold T1(N) and a search space R4(N) exists above threshold T4(N).

In a scheme using four conversion engines the resolution of each bit trial remains the same as that of a three converter engine However, the use of four converters allows the next trial range to be expanded. By offsetting the thresholds by ½ of the (N+1)th current least significant bit, recovery from both previous incorrectly set or rejected bits can be achieved.

Thus, as shown in FIG. 3, the Nth trial determines that the input value 40 lies above T2(N) and below T3(N). In the prior art, the (N+1)th trial would be restricted to further refining the result in a search space banded by T2(N) and T3(N). In the present invention each search range R(N+1) is one quarter of the size of the R(N)th search spaces, but the values of the thresholds have themselves been offset, in this example downwardly, by 0.5R(N+1). As a consequence the next search is made in a space that spans from T2(N)−⅛(T2(N)−T1(N)) to T3(N)+⅛(T4(N)−T3(N)).

The search ranges are, when necessary, truncated by the minimum and maximum values of the converter's ranges.

In practise these ranges can be set quite easily.

It is useful to consider several worked examples to see how a converter operates both without the range expansion, and with both the range expansion and the inclusion of redundant bits.

In each of the FIGS. 4a to 4f multiple conversion engines are operating in a collaborative mode. The trial number is denoted by T1, T2 and T3 for the first, second and third trials respectively. Within any given trial the conversion engines are set to different bits values. Each engine is denoted E1, E2 and so on, respectively.

The bit weights are represented in each trial. In some examples additional (redundant) bits are provided, and they are designated by the letter "R". Also shift weights or negative weights are also provided. These are designated by the term "S". Negative weights are formed from real capacitors whose switching is effectively inverted compared to the "normal" positive weight capacitors.

In the example illustrated in FIG. 4a, the capacitors are provided in a binary array and have weights 32, 16, 8, 4, 2 and 1. Suppose, using this array we wish to digitise an analog signal that has a value of 24.75.

In the first trial, T1, the first conversion engine E1 has the 32 and 16 bits set to 0 and 1 respectively. This gives a total of 16. Hence the conversion engine determines that the value it is testing is less than the analog input signal.

Conversion engine E2 has the 32 and 16 bits set to 1 and 0 respectively, giving a value of 32, which the converter determines is too big compared to the analog input.

The third converter has its 32 and 16 bits set to 1 and 1 respectively, giving a value of 48 which is also too big.

As only E1 had a value which was less than the analog value, its bits 01, are carried forward to the second test.

In the second trial, T2 each engine has its 32 and 16 bits set to 0 and 1 respectively. The next most significant bits having weights 8 and 4 are tested with each engine repeating the 01 for E1, 10 and E2 and 11 for E3 sequence. In this trial both E1 and E2 have values less than the analog value being tested. Thus E3 is discarded and the higher value of E1 and E2, i.e. E2, is kept and taken forward to the next trial. This number corresponds to the value 24.

In the third trial all of the trials are discarded because each has a value greater then the value being tested. Therefore, in this example "01 10 00" is the correct answer.

FIG. 4b shows what appears in the same converter if noise in conversion engine E1 causes it to return an incorrect result thereby causing the first bits to be incorrectly set to 00. It can be seen that the converter never recovers from this error and in the end returns a value of 15.

FIG. 4c shows the conversion, this time being performed with ADC engines having capacitor weights of 32, 16, 16, −8, 8, 4, 4, −2, 2, 1, 1, −0.5.

In each trial, four conversion engines are used, with the most significant bits being tested at each stage being set to 00, 01, 10 and 11 for engines E1 to E4 respectively. Also each pair of bits being trialled are associated with a redundant bit and a shift bit.

It can be seen that in the first trial T1 of FIG. 4c the 32 and 16 bits are trialled, and the 16 redundant bit and a −8 shift bit are set for all four engines. Thus the values which are tested amount to 8, 24, 40 and 56. As the value being tested corresponds to 24.75, the first trials from the engines E1 and E2 are less then the analog value whereas the trials from E3 and E4 are too big. Therefore the largest value which is less than the value being tested, i.e. the output of E2, is carried forward to the next stage of the trial.

The value carried forward includes the contribution from the redundant bit and the shift bit.

At the next stage, T2, the 8 and 4 weighted bits are trialled, with a redundant 4 bit being set and a −2 shift bit also being set. In each trial in T2, the output value is too big compared to the analog value being tested. Consequently the 8, 4 and redundant 4 bits are cleared. The −2 shift bit is retained. Note that in all cases once the shift bit has been set it remains set till the end of the conversion.

In the third trial T3, the process is repeated on the next group of bits, which have values 2, 1, 1, −0.5. During the third trial, the largest value which is not too big is correctly selected to be 24.5. This is the correct answer as the input lies between 24.5 and 25.5.

The final trial in this example may be split into two trials T3 and T4 with each converters working independently such that thermal noise is uncorrelated in each converter and each comes to an individual result. In this case the trial weight of 2 would be tested in bit trial T3 and the trial weight of 1 would be tested in an additional bit trial T4. R and S would then not be set for these 2 trials. The output of the 4 converters can simply be added together. The result is 4 times too big, but can be normalised by dividing by 4, which in its simplest implementation simply means discarding the last two bits of the summation.

Alternatively the converters may still work in a collaborative manner at this stage. This is a design choice made by the designer, and would be mainly determined by the expected matching between the conversion engines.

FIG. 4d shows the same trial being conducted, but an error in the first trial, due for example to noise, causes conversion engine E2 to incorrectly indicate that its value is too big. Thus the selection carried forward into the second trial T2 is significantly under weight. Nevertheless, the extra weight provided by the redundant bits allows the correct answer to be determined by the end of the third trial.

FIGS. 4e and 4f repeat the process of FIGS. 4c and 4d. However, it can be seen that the most significant value in each trial has been split into two further capacitors. Thus the 32 value bit capacitor in the ADC engines are replaced by two 16 value bit capacitors.

Similarly in the second trial the 8 value bit is replaced by two 4 value bits, and so on. This means that, starting from the least significant bit, the values in the ADC are $-2^{-1}, 2^0, 2^0, 2^0, 2^0, -2^1, 2^2, 2^2, 2^2, 2^2, -2^3, 2^4, 2^4, 2^4, 2^4,$ and so on.

FIG. 4g shows an example where bit trials during the first phase, T1 and T2 are performed in a collaborative manner while bit trials during the second phase, T3, T4 and T5 are performed conventionally by converter E1 alone. Bit trial T3 tests a redundant bit of weight 4 with an associated shift capacitor of weight −2. In this example converter E2 has an offset of 1.5. During bit trial T2 the offset results in a weight of 31.5 (rather than the ideal value of 30) being compared with the input value of 30.75 which results in this weight being incorrectly rejected. However the redundancy provided by the redundant bit during bit trial T3 means that the converter still achieves the correct answer of 30 by the end of the conversion process. Example 4h shows the same converter except there is no redundancy during phase 2 i.e. in the third and fourth bit trials. In this case the converter does not recover from the error made during bit trial T2. Example 4g and 4h are provided to stress the importance of providing redundancy during phase 2 to allow correction of errors made during phase 1 due to mismatch between the collaborative converters. Although in this example, for simplicity, the phase 2 conversions are only done by converter E1, in practice to improve the noise performance, it would be expected that converters E2-E4 would also be used during phase 4. The operation of the 4 converters during this phase would be either independent, with the results from the 4 converters being added together digitally, or with the DAC outputs combined with switches to reduce the affect of thermal noise and the result from just one of the comparators being acted upon.

The converters are formed from well known switched capacitor technology devices and hence the architecture and specific fabrication of the converters is not of primary interest here and need not be described in detail.

It can be seen that three bits could be set in one go using the principle of the present invention. This would require a minimum of $2^3-1=7$ thresholds to be established, conveniently by seven converter engines but preferably $2^3$ converter engines would be provided so as to provide for range extension.

Figure 5:
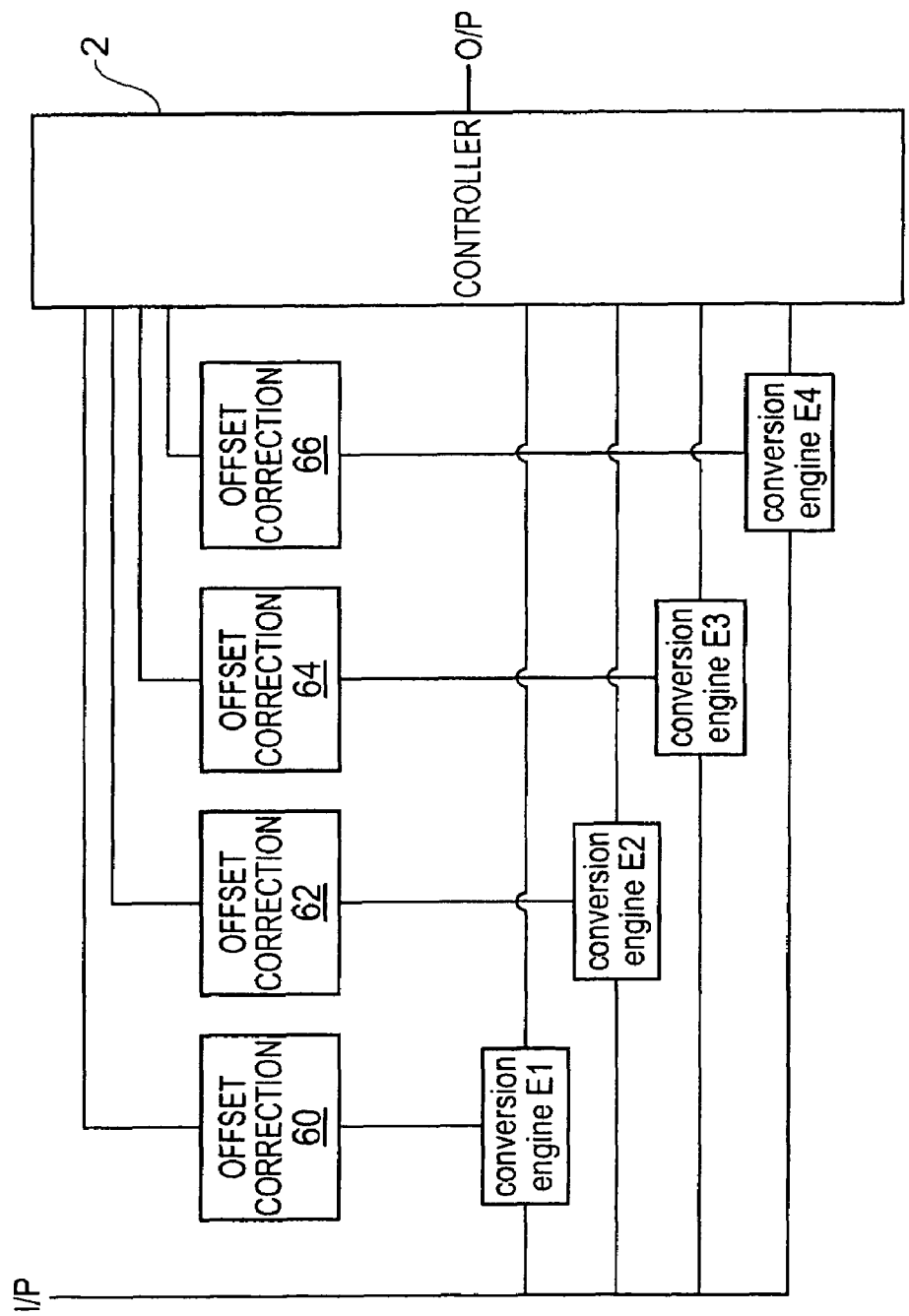
FIG. 5 is a schematic diagram of an ADC having four conversion i.e. engines with offset correction.

Each converter E1 to E4 will inherently have its own offset. Offset and gain errors will have been reduced at the time of manufacture by the manufacturer, nevertheless it remains possible that some offset will remain. Offset compensation can be achieved dynamically within the present invention so as to improve its performance. As shown in FIG. 5, each conversion engine E1 to E4 is associated with a respective offset correction circuit 60 to 66 which can generate an offset in response to control signals from the controller 2.

It will be apparent that, over many samples, each converter should output the same value, as they have a common input. Therefore the controller need only keep a running total of the output of each converter over a sufficiently large number of conversions in order to detect if one converter has an offset relative to the other converters. The controller can then set an offset correction via one or more of the offset correction circuits 60 to 66. In a preferred implementation the offset correction circuits are digital to analog converters. However offset compensation can also be achieved by modifying the switch positions for the capacitors of the capacitors in the array at the time of sampling the input signal. Given that only relative offsets can be compensated for in this way it is desirable that the value of each offset correction is adjusted such that the sum of the corrections is a near constant value.

It is tempting to think that adding together the results of say 4 12-bit ADCs will yield a 14 bit result. However, 4 identical, ideal noiseless ADCs will all give exactly the same result. There is then no additional information to increase the 12 bit result to any higher resolution. Suprisingly, thermal noise or intentionally applied dither can de-correlate the separate ADCs to actually yield a higher resolution result.

Dither can be thought of as just a programmable offset that is randomly varied between conversions. Different values of dither would be applied to each of the ADCs. In its simplest implementation, the sum total of the dither applied each conversion is kept the same. Alternatively the total value of dither added each conversion is subtracted digitally from the sum of the individual ADC results.

In a preferred embodiment four 12 bit converters are provided, and the first four bit trials are done as collaborative bit trials, thereby setting the first eight bits. After these trials have been completed the comparators are allowed to work independently. Thus the operation would be

| Trial | Bits tested |
|-------|-------------|
| 1 | 11, 10 |
| 2 | 9, 8 |
| 3 | 7, 6 |
| 4 | 5, 4 |
| 5 | 4 (redundant bit) |
| 6 | 3 |
| 7 | 2 |
| 8 | 1 |
| 9 | 0 |

It is possible to further improve the device by enabling the sampling capacitors of the individual ADC engines to be selectively connected together.

Figure 6:
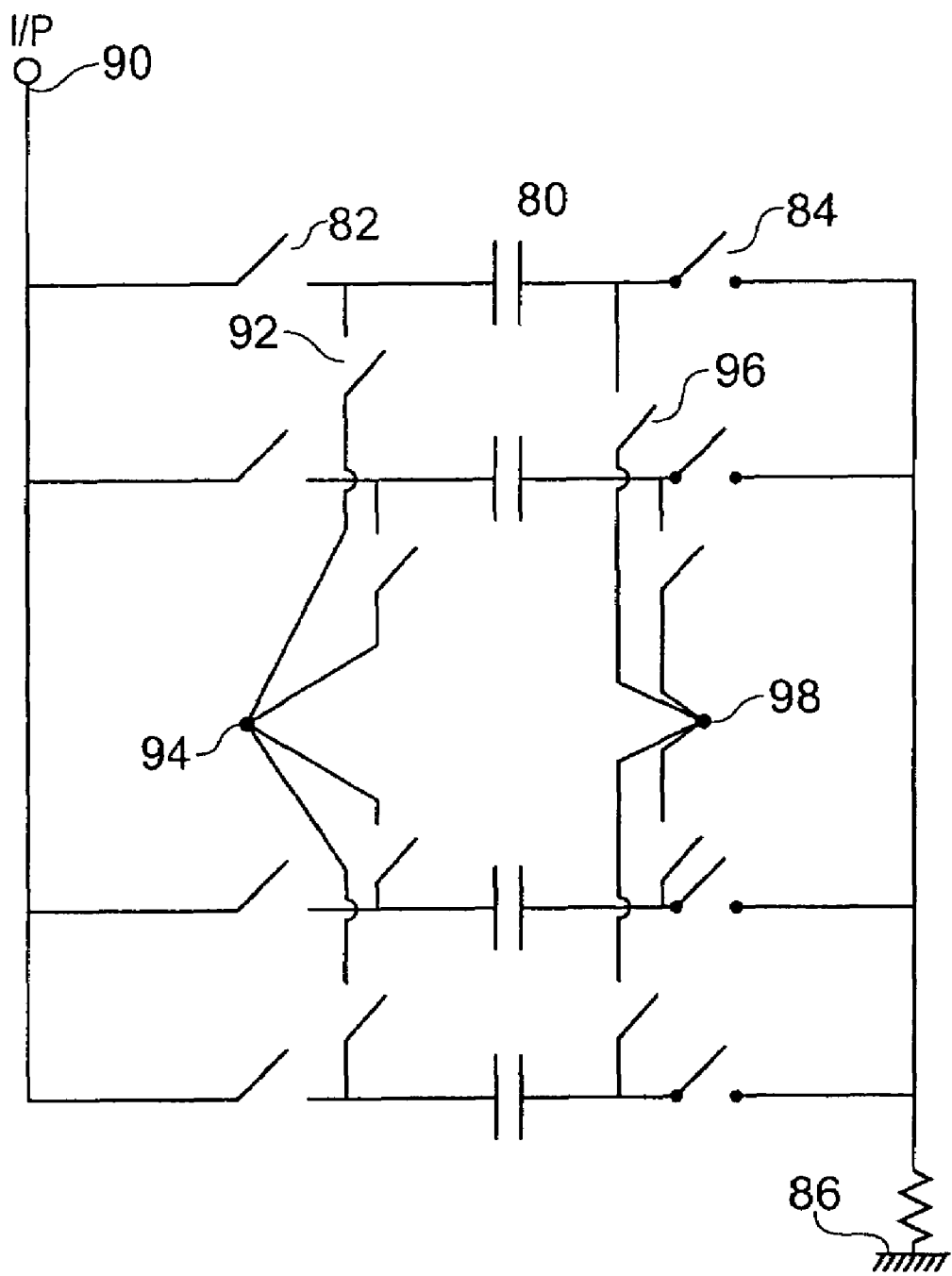
FIG. 6 is a circuit diagram showing the connections to sampling capacitors of the conversion engines.

FIG. 6 schematically shows the sampling arrangements for the conversion engines E1 to E4. The inputs are identical and consequently only one will be described in details. Engine E1 has a sampling capacitor 80 located between a left-hand sample switch 82 and a right-hand sample switch 84. The right-hand sample switch 84 can be closed in order to connect the right-hand plate of a capacitor (as shown in the drawing) to a common mode reference 86. The left-hand sample switch 82 can be closed to connect the left-hand plate of the capacitor 80 to the input line 90. A left-hand side shorting switch 92 can be closed to connect the left-hand plate of the capacitor 80 to a floating common node 94. Similarly a right-hand side shorting switch 96 can be closed to connect the right-hand plate of a capacitor to a second floating common node 98. The other input channels are similarly constructed.

During signal acquisition the switches 82 and 84 in the first channel, and corresponding switches in the other sampling channels for the other converters are closed in order to allow the input signal to be sampled onto the respective capacitors. The speed at which these electronic switches open and close, whilst close, varies slightly, as does the resistance of the series bandwidth limiting resistor 85. Therefore, if each of the capacitors is sampling a high frequency signal, then even though the sampling instance are nominally common, each capacitor will end up with a slightly different value sampled onto it. This problem can be alleviated by closing the shorting switches 92 and 96 during the sample, and leaving the switches momentarily in a conducting state after the sampling switches have been opened. This allows charge redistribution to occur.

Figure 7:
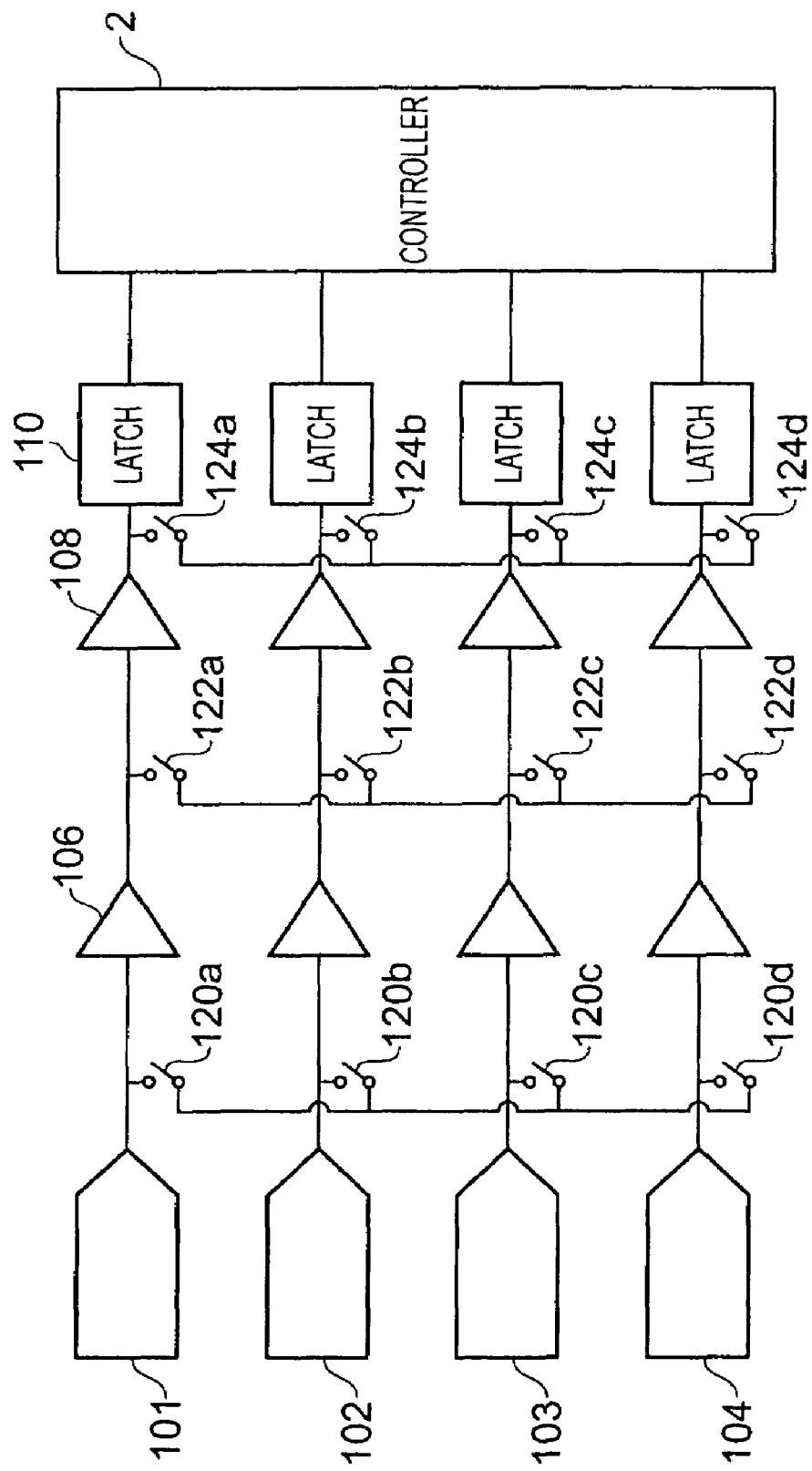
FIG. 7 shows an alternative embodiment of the present invention.

FIG. 7 schematically illustrates a further embodiment of the present invention in which four conversion engines 101 to 104 each comprise a capacitive array of switched capacitors which acts both as a sampling capacitor and has a digital to analog converter which is well known in the art. As noted before, each of these conversion engines is approximately one quarter of the size of a normal conversion engine, and this results in reduced current but also in degraded noise performance. Each conversion engine is followed by one, and most probably two preamplifiers 106 and 108 arranged in series. The output of the preamplifier 108 is then provided to a latch/comparator 110 which provides its output to the control circuit 2. Each circuit is identical. After performing several conversions as independent conversion engines, it is possible to connect the switched capacitor arrays of the conversion engines 101 to 104 in parallel by way of switches 120a to 120d. This reduces the thermal noise occurring across the capacitors because the effective capacitance is increased by a factor of 4. Each preamplifier 106 and 108 is also a source of noise, but the thermal noise occurring from each preamplifier is uncorrelated with the noise occurring from equivalent preamplifiers in the other channels. Therefore the noise power can effectively be reduced by providing further switches 122a to 122d which enables the outputs of the first preamplifier in each channel to be connected to a common node. Similarly further switches 124a to 124d enables the outputs of the second preamplifiers 108 in each channel to be connected to a common node. The outputs can then supplied to a single one of the comparator/latches 110 which then acts to make a decision for the converter when it is operating in a single bit by bit trial process.

It may also be advantageous for the first (and possibly further) bit trial to be a single bit (non-collaborative) trial. This reduces the possibility of voltages within the switched capacitor array occurring that might switch on parasitic components within the integrated circuit. This can be regarded as a trial preceding the "first phase".

The techniques of using one converter to set the most significant bit under test and using a second converter to set the next most significant bit under test, and then performing addition and subtraction in the analog domain to make three decision thresholds from two converters can also be used in embodiments of the present invention provided that provision is also made for the converters to work independently.

It is thus possible to provide an improved analog to digital converter which, in initial trials, exhibits a useful speed improvement over a conventional successive approximation converter without any power or noise penalties.

The invention claimed is:

1. An analog to digital converter comprising a plurality of analog to digital conversion engines and a controller for controlling the operation of the analog to digital conversion engines such that:
   a) during a first phase of an analog to digital conversion process the engines co-operate such that a plurality of bits can be determined during a single trial step;
   b) during a second phase of the analog to digital conversion the conversion engines work independently; and
   c) the controller receives the outputs of at least one of the conversion engines and processes them to provide an output word.

2. An analog to digital converter as claimed in claim 1 having at least three conversion engines.

3. An analog to digital converter as claimed in claim 2, further comprising a fourth conversion engine such that for an (N+1)th bit trial a trial space examined by the analog to digital converter is greater than one-quarter of the trial space of the Nth bit trial, where N is an integer.

4. An analog to digital converter as claimed in claim 3, in which the trial range of a current bit trial is offset.

5. An analog to digital converter as claimed in claim 4, in which the offset corresponds to half of the size of the least significant bit being tested.

6. An analog to digital converter as claimed in claim 1, in which the conversion engines include redundant bits for error correction.

7. An analog to digital converter as claimed in claim 1, wherein at least one of the conversion engines is responsive to an offset compensation circuit for introducing an offset to the conversion engine.

8. An analog to digital converter as claimed in claim 7, in which the controller examines the output of each of the conversion engines while they are operating independently and is adapted to modify the offset compensation provided by the compensation circuit associated with a conversion engine to bring the output of the conversion engines into conformity.

9. An analog to digital converter as claimed in claim 8, in which the value of a sum of the offsets applied to the conversion engines is maintained at a preset value.

10. An analog to digital converter as claimed in claim 8, in which the controller forms a sum of the offsets applied to the conversion engines and uses this to apply a correction to a output from the analog to digital converter.

11. An analog to digital converter as claimed in claim 1, in which the analog to digital conversion is temporarily halted during the first phase, and an error correction step is performed in which all of the conversion engines are set to the same trial word and the capacitor arrays are temporarily connected together such that they have the same voltage on each array for the same digital word.

12. An analog to digital converter as claimed in claim 1, further comprising a dither generator for introducing a known perturbation independently to the conversion engines during the second phase of the analog to digital conversion.

13. An analog to digital converter as claimed in claim 1, further including a most significant bit trial phase, in which the converters do not work in a collaborative manner.

14. An analog to digital converter, comprising a plurality of analog to digital conversion engines, each having a sampling capacitor or a capacitor array onto which a value to be converted is sampled, and wherein a controller array is provided for controlling the operation of the conversion engines such that:
   a) during a first phase of the analog to digital conversion process, the engines co-operate such that a plurality of bits are determined in a single trial step; and
   b) during a second phase of the analog to digital conversion process the sampling arrays or sampling capacitors of the conversion engines are connected together so as to form a composite converter for use in single bit trials.

15. An analog to digital converter as claimed in claim 14, comprising at least three conversion engines.

16. An analog to digital converter as claimed in claim 14, comprising four conversion engines.

17. An analog to digital converter as claimed in claim 16, wherein an (N+1)th bit trial following an Nth bit trial has a trial space greater than one quarter of the trial space of the Nth bit trial.

18. An analog to digital converter as claimed in claim 17, where the trial range of the (N+1)th bit trial is offset by one half of the least significant bit being trialled in the (N+1)th trial.

19. A method of converting an analog value into a digital equivalent, the method comprising the steps of:
   a) sampling a signal to be converted into a plurality of successive approximation analog to digital converters;
   b) operating the converters in a first phase of the conversion such that at least two bits can be determined during each successive approximation trial;
   c) operating the converters in a second phase of the conversion such that the converters operate independently such that fewer bits are determined during each successive approximation trial than were determined during the first phase; and
   d) outputting a result obtained from at least one of the converters.

20. A method as claimed in claim 19, in which during the first phase two bits are determined per trial and during the second phase one bit is determined per trial.

21. A method as claimed in claim 19, in which the outputs of the converters are combined to give an output value.

22. A method of converting an analog value into a digital value, the method comprising the steps of:
   a) sampling a signal to be converted onto at least two successive approximation analog to digital converters;
   b) operating the converters in a first phase of operation such that they co-operate to determine at least two bits during at least one successive approximation trial; and
   c) in a second phase of operation connecting sampling capacitor arrays of the converters in parallel so as to form a combined converter, and continuing the bit trials.

* * * * *